United States Patent
Jau et al.

(10) Patent No.: US 9,811,125 B2
(45) Date of Patent: *Nov. 7, 2017

(54) HARD DRIVE TRAY DEVICE

(71) Applicant: Quanta Computer Inc., Taoyuan (TW)

(72) Inventors: Maw-Zan Jau, Taoyuan (TW);
Chao-Jung Chen, Taoyuan (TW);
Yaw-Tzorng Tsorng, Taoyuan (TW);
Chung-Hua Jen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/056,427

(22) Filed: Feb. 29, 2016

(65) Prior Publication Data

US 2016/0357228 A1 Dec. 8, 2016

Related U.S. Application Data

(63) Continuation of application No. 13/871,971, filed on Apr. 26, 2013, now Pat. No. 9,304,556.

(30) Foreign Application Priority Data

Jun. 25, 2012 (TW) .............................. 101212183 U

(51) Int. Cl.
*G06F 1/16* (2006.01)
*G06F 1/18* (2006.01)
*G11B 33/02* (2006.01)
*H05K 7/14* (2006.01)

(52) U.S. Cl.
CPC ................ *G06F 1/187* (2013.01); *G06F 1/18* (2013.01); *G11B 33/02* (2013.01); *H05K 7/1489* (2013.01); *H05K 7/14* (2013.01); *H05K 7/1491* (2013.01)

(58) Field of Classification Search
CPC ...... H05K 7/1491; H05K 7/14; H05K 7/1489; G06F 1/187; G06F 1/18; G11B 33/128; G11B 33/02
USPC ........................................ 361/679.37–679.39
See application file for complete search history.

(56) References Cited

U.S. PATENT DOCUMENTS

| 2002/0181197 A1* | 12/2002 | Huang | H05K 7/1421 361/679.39 |
| 2005/0194287 A1* | 9/2005 | Lien | H05K 7/1489 206/565 |
| 2006/0065424 A1* | 3/2006 | Mead | H05K 7/1491 174/69 |
| 2015/0201522 A1* | 7/2015 | Jau | G11B 33/128 312/330.1 |

* cited by examiner

Primary Examiner — James Wu
(74) Attorney, Agent, or Firm — Nixon Peabody LLP; Eduardo J. Quinones; Zhou Lu

(57) ABSTRACT

A hard drive tray device applied in a server is provided. The server includes a housing. The hard drive tray device includes a rail member and a tray. The rail member is disposed at the inner wall of the housing. The tray is slidably engaged with the rail member so as to slide between an expanded position and a closed position relative to the housing. The tray includes a base for carrying two storage devices. The base has a hollow portion. The storage devices are respectively located at two sides of the hollow portion. When the tray slides to the expanded position, one of the storage devices and at least a part of the hollow portion are located outside the housing.

10 Claims, 3 Drawing Sheets

HARD DRIVE TRAY DEVICE

CROSS-REFERENCE TO RELATED APPLICATIONS

This application is a Continuation of U.S. Non-Provisional application Ser. No. 13/871,971 entitled "HARD DRIVE TRAY DEVICE", which claims priority to Taiwan Application Serial Number 101212183, filed Jun. 25, 2012, which is herein incorporated by reference.

FIELD OF THE INVENTION

The present disclosure relates to a tray device for hard drives, more particularly, to a tray device for carrying hot-swappable hard drives.

BACKGROUND

Hot-swappable devices in a server usually include a hot-swappable power source, a hot-swappable hard drive, a hot-swappable battery, and a hot-swappable fan. The hot-swappable devices are usually installed on a panel or a backplate of the server and can be replaced directly from the panel or backplate. A hot-swappable device usually has a handle to be held and a latch for positioning after the hot-swappable device has been installed. Hot swapping refers to the ability to directly connect or remove components from a computer system without shutting down the computer system. Hot-swap capability is especially important with server-class systems, allowing the system to be expanded for better performance without interrupting services.

With present configurations, after a hard drive is fastened to a conventional hot-swappable hard drive tray, the hot-swappable hard drive tray can be installed in a host by sliding along slide rails of the host. Typically, the hard drive is fastened to the hard drive tray using screws.

However, the conventional hard drive tray allows for installation of only one hard drive thereon. When a user pulls out the hard drive tray, the signals and power to the hard drive on the hard drive tray will be interrupted, resulting in a long interruption for the system. The system subsequently needs some time to re-establish data connections. In addition, a server that supports hot-swappable hard drive trays usually has a standard size, and so in an application that requires a lot of hard drives, use of conventional hard drive trays in the server allows for accommodation of only a relatively small number of hard drives. Therefore, if the number of hard drives is increased, the number of servers also needs to be increased. This results not only in increased costs, but a large volume for the whole computer system.

SUMMARY

The disclosure provides a hard drive tray device in which at least two carrying portions are disposed on a base of a tray, and the carrying portions can respectively carry two storage devices, thereby allowing the number of storage devices accommodated in a single server to be increased. The hard drive tray device of the disclosure includes a rail member that is disposed at the inner wall of the housing of the server and is slidably engaged with the tray, so when the rear storage devices (i.e., the storage devices that are deeper in the housing) need to be repaired, a user can assemble/disassemble the rear storage devices in the same way that the front storage devices (i.e., the storage devices that are closer to the periphery of the housing) are assembled/disassembled, namely, by simply pulling the tray out of the housing. In addition, a hollow portion is formed on the base and located between the carrying portions. Therefore, when the server is installed at a high place, the user can easily assemble/disassemble the rear storage devices by passing a hand through the hollow portion from the bottom of the tray after the tray is pulled out of the housing. Moreover, the hard drive tray device of the disclosure includes a cable bracket that is operatively connected to the inner wall of the housing. The cable bracket can slide to be folded relative to the housing together with the tray and be attached by transmission cables used to connect the storage devices to the server. Therefore, when the user pulls out the hard drive tray device, the transmission cables that attach on the cable bracket do not interfere with the movement of the hard drive tray device. Furthermore, because the transmission cables are still connected among the storage devices and the server during the moving of the hard drive tray device, the power and signals provided to the storage devices will not be interrupted.

According to an embodiment of the disclosure, a hard drive tray device is applied in a server. The server includes a housing. The hard drive tray device includes a rail member and a tray. The rail member is disposed at the inner wall of the housing. The tray is slidably engaged with the rail member so as to slide between an expanded position and a closed position relative to the housing. The tray includes a base for carrying two storage devices. The base has a hollow portion. The storage devices are respectively located at two sides of the hollow portion. When the tray slides to the expanded position, one of the storage devices and at least a part of the hollow portion are located outside the housing.

In an embodiment of the disclosure, the base includes a first carrying portion and a second carrying portion. The first carrying portion and the second carrying portion are respectively located at two sides of the hollow portion and respectively carry the storage devices. When the tray slides to the closed position, the first carrying portion and the second carrying portion are located in the housing. When the tray slides to the expanded position, the first carrying portion is located outside the housing, and the second carrying portion is located in the housing.

In an embodiment of the disclosure, when the tray slides to the expanded position, the hollow portion is entirely located outside the housing, and the second carrying portion is aligned with an edge of the housing.

In an embodiment of the disclosure, the hollow portion has a width between the first carrying portion and the second carrying portion, and the width is greater than the length of any of the storage devices.

In an embodiment of the disclosure, the hard drive tray device further includes two racks. The racks are respectively disposed on the first carrying portion and the second carrying portion. Each of the storage devices is removably accommodated in the corresponding rack.

In an embodiment of the disclosure, a removal direction of each of the storage devices relative to the corresponding rack is parallel to a sliding direction of the tray relative to the housing.

In an embodiment of the disclosure, the hard drive tray device further includes a handle connected to the first carrying portion.

In an embodiment of the disclosure, the storage devices are electrically connected to the server by using two transmission cables respectively. The hard drive tray device further includes a cable bracket operatively connected to the inner wall of the housing. The cable bracket is expanded or folded together with the sliding of the tray relative to the housing. The transmission cables are attached on the cable bracket.

In an embodiment of the disclosure, the cable bracket includes a first bracket portion and a second bracket portion. One end of the first bracket portion is pivotally connected to the inner wall of the housing. Two ends of the second bracket portion are pivotally connected to the base and another end of the first bracket portion, respectively.

In an embodiment of the disclosure, the tray further includes a side plate connected to an edge of the base for slidably engaging the rail member.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
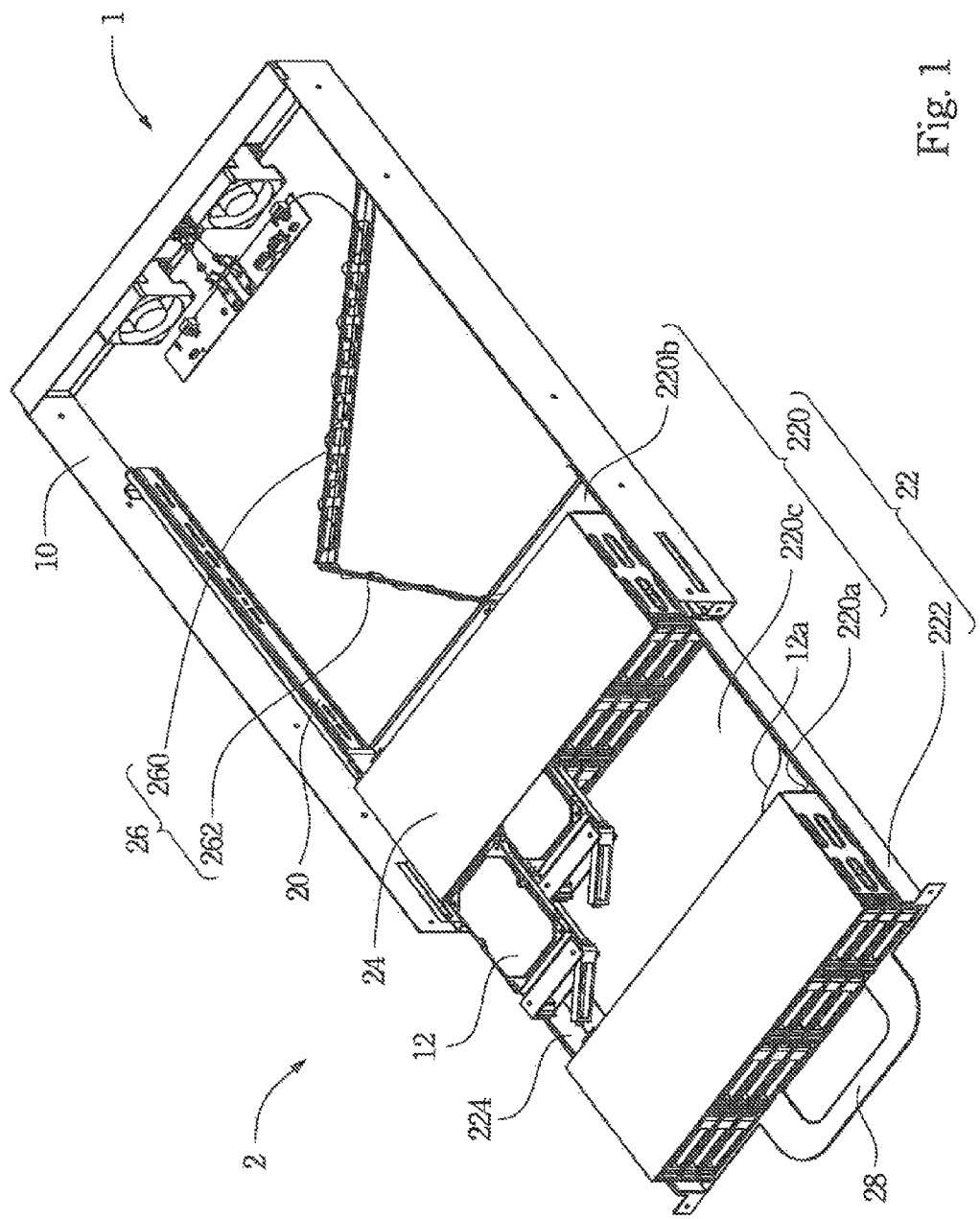
FIG. 1 is a perspective view of a hard drive tray device according to an embodiment of the disclosure, in which a tray is located at an expanded position relative to a housing.

Reference will now be made in detail to the present embodiments of the disclosure, examples of which are illustrated in the accompanying drawings. Wherever possible, the same reference numbers are used in the drawings and the description to refer to the same or like parts.

The hard drive tray device of the disclosure can be used to carry storage devices (e.g., a floppy drive, a hard drive, a CD-ROM drive, etc.) that are generally installed in a server, but the disclosure is not limited in this regard. Particularly, the hard drive tray device of the disclosure can be used to carry hot-swappable storage devices. As long as there exists a need of continually providing power and signals to storage devices when the hard drive tray device has been pulled out, the concepts of the disclosure may be applied to achieve the hard drive tray device.

Figure 2:
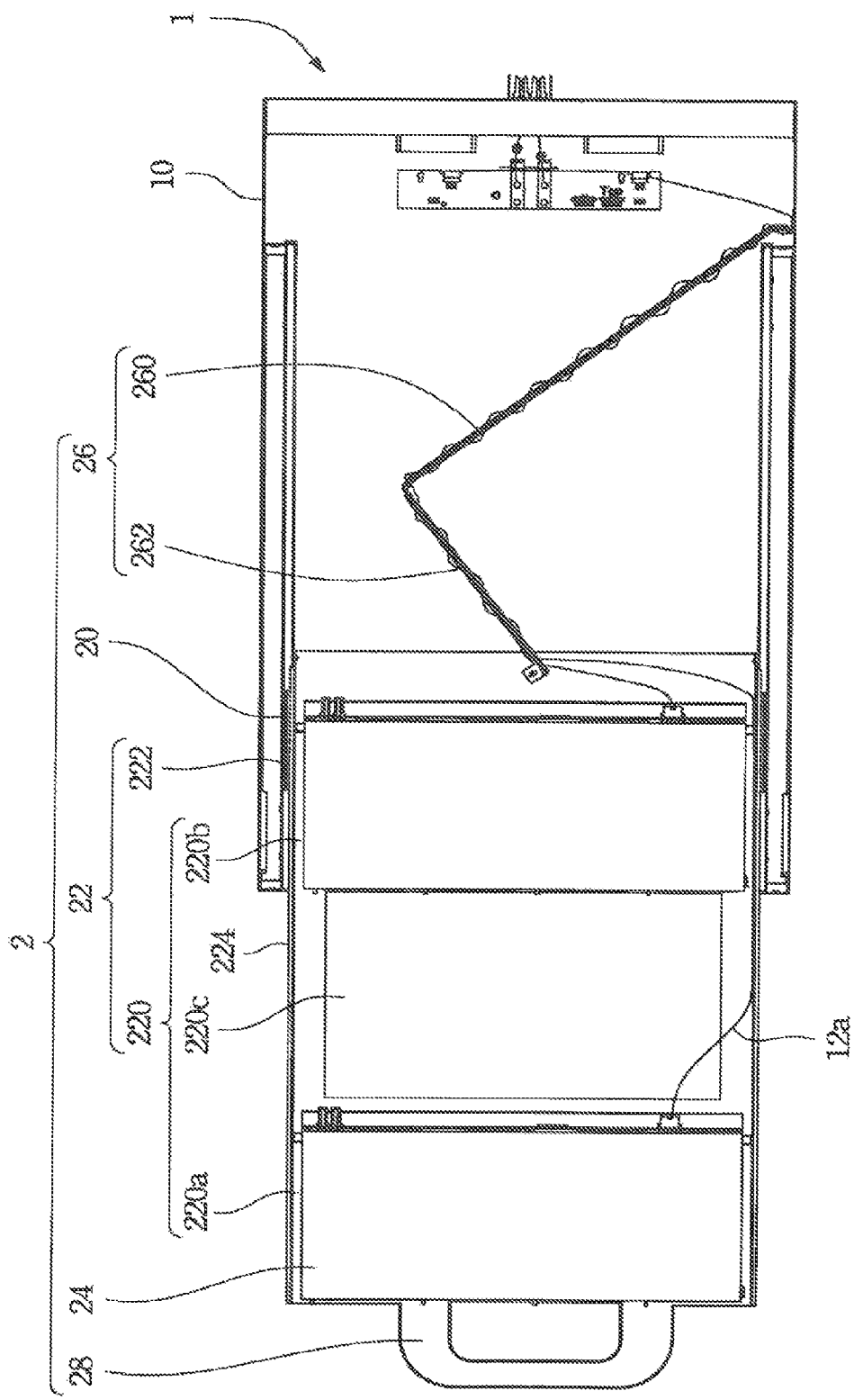
FIG. 2 is a top view of the hard drive tray device in FIG. 1.
Figure 3:
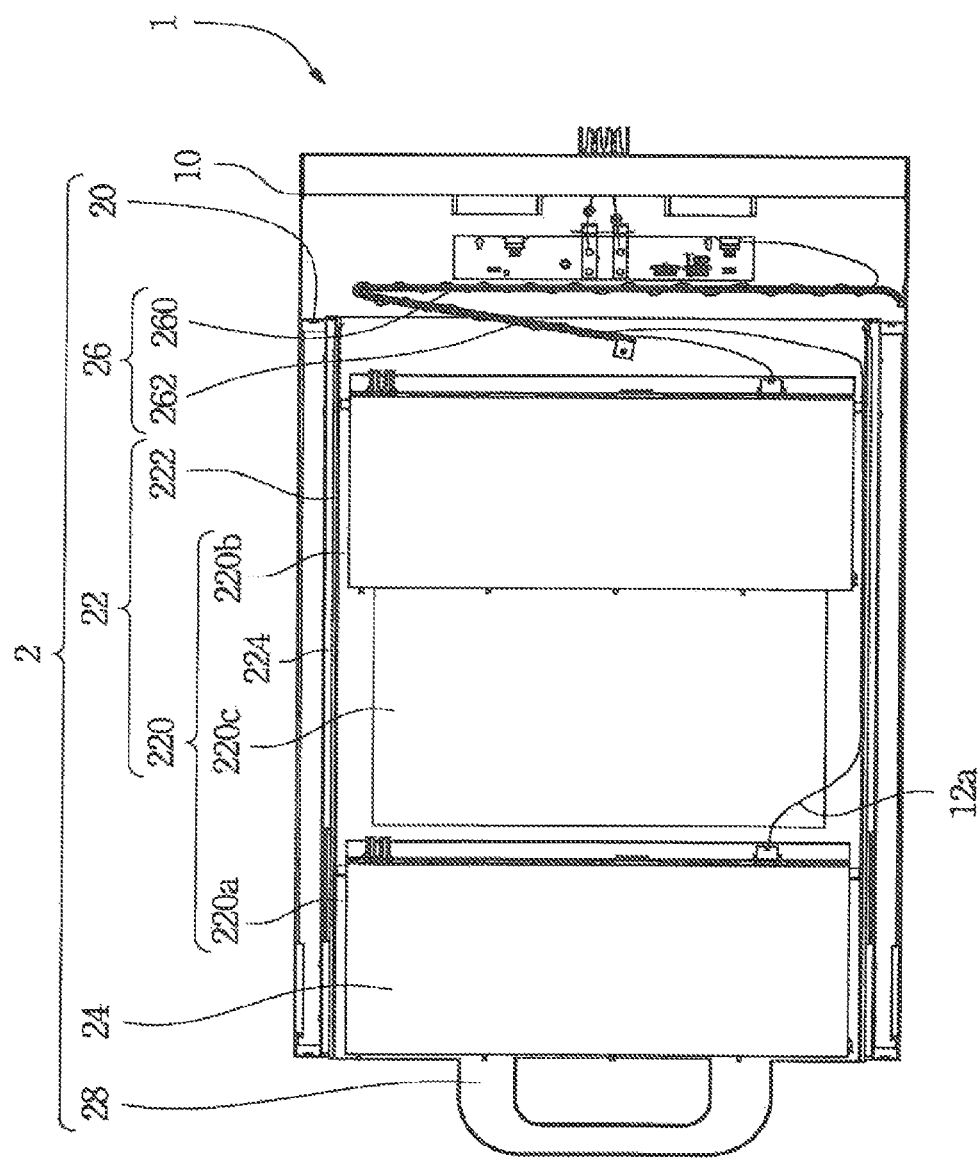
FIG. 3 is another top view of the hard drive tray device in FIG. 1, in which the tray is located at a closed position relative to the housing.

FIG. 1 is a perspective view of a hard drive tray device 2 according to an embodiment of the disclosure, in which a tray 22 is located at an expanded position relative to a housing 10. FIG. 2 is a top view of the hard drive tray device 2 in FIG. 1. FIG. 3 is another top view of the hard drive tray device 2 in FIG. 1, in which the tray 22 is located at a closed position relative to the housing 10.

As shown in FIG. 1, FIG. 2, and FIG. 3, the hard drive tray device 2 is used in a server 1. The server 1 includes the housing 10. The hard drive tray device 2 includes a rail member 20 and the tray 22. The rail member 20 of the hard drive tray device 2 is disposed at the inner wall of the housing 10 of the server 1. The tray 22 of the hard drive tray device 2 includes two side plates 224. The side plates 224 of the tray 22 slidably engage the rail member 20. Therefore, the hard drive tray device 2 can slide relative to the housing 10 of the server 1 between the expanded position as shown in FIG. 2, and the closed position as shown in FIG. 3. The tray 22 of the hard drive tray device 2 further includes a base 220 for carrying a plurality of storage devices 12. The side plates 224 of the tray 22 are respectively connected to two opposite edges of the base 220.

As shown in FIG. 1, the base 220 of the tray 22 includes a first carrying portion 220a and a second carrying portion 220b and has a hollow portion 220c. The first carrying portion 220a and the second carrying portion 220b of the base 220 are respectively located at two sides of the hollow portion 220c, and each carries a specific number of the storage devices 12. The number of the storage devices 12 carried by the first carrying portion 220a may be the same as or different from the number of the storage devices 12 carried by the second carrying portion 220b. The first carrying portion 220a of the base 220 is used to carry front storage devices 12 (i.e., the storage devices 12 that are closer to the periphery of the housing 10), and the second carrying portion 220b of the base 220 is used to carry rear storage devices 12 (i.e., the storage devices 12 that are deeper in the housing 10). Moreover, due to the fact that the first carrying portion 220a and the second carrying portion 220b of the base 220 are respectively located at two sides of the hollow portion 220c, the storage devices 12 located on the first carrying portion 220a and the storage devices 12 located on the second carrying portion 220b are also respectively located at two sides of the hollow portion 220c.

In addition, as shown in FIG. 1, the hard drive tray device 2 further includes two racks 24. The racks 24 of the hard drive tray device 2 are respectively disposed on the first carrying portion 220a and the second carrying portion 220b of the base 220. Each of the storage devices 12 is removably accommodated in the corresponding rack 24. The number of storage devices 12 that each of the racks 24 can accommodate can be adjusted as needed.

As shown in FIG. 3, when the tray 22 of the hard drive tray device 2 slides to the closed position relative to the housing 10 of the server 1, the first carrying portion 220a and the second carrying portion 220b of the base 220 are located in the housing 10 of the server 1. Therefore, if the front storage devices 12 need to be repaired, a user can directly pull the front storage devices 12 out of the rack 24 that is located on the first carrying portion 220a of the base 220.

As shown in FIG. 2, when the tray 22 of the hard drive tray device 2 slides to the expanded position relative to the housing 10 of the server 1, the first carrying portion 220a of the base 220 is located outside the housing 10, and the second carrying portion 220b is located in the housing 10. Therefore, if the rear storage devices 12 need to be repaired, the user can directly pull the rear storage devices 12 out of the rack 24 that is located on the second carrying portion 220b of the base 220 in the same manner that the front storage devices 12 are pulled out. Furthermore, when the server 1 is installed at a high place, the user can easily assemble/disassemble the rear storage devices 12 by passing a hand through the hollow portion 220c from the bottom of the base 220 of the tray 22 after the tray 22 is pulled out of the housing 10, and take out the rear storage devices 12 from the bottom of the base 220 by passing the rear storage devices 12 through the hollow portion 220c after they have been removed from the rack 24 that is located on the second carrying portion 220b of the base 220.

As shown in FIG. 1 and FIG. 3, when the tray 22 of the hard drive tray device 2 slides relative to the housing 10 of the server 1 to the expanded position, the hollow portion 220c of the base 220 is entirely located outside the housing 10, and the second carrying portion 220b of the base 220 is aligned with an edge of the housing 10. However, it is noted that the disclosure is not limited in this regard.

In another embodiment of the disclosure, when the tray 22 of the hard drive tray device 2 slides to the expanded position relative to the housing 10 of the server 1, a part of the hollow portion 220c of the base 220 is located outside the housing 10, and another part of the hollow portion 220c is located in the housing 10.

In another embodiment of the disclosure, when the tray 22 of the hard drive tray device 2 slides to the expanded position relative to the housing 10 of the server 1, not only is the hollow portion 220c of the base 220 entirely located outside the housing 10 of the server 1, but a part of the second carrying portion 220b of the base 220 is located outside the housing 10.

As long as the user can pass a hand through the hollow portion 220c and take out the rear storage devices 12 again through the hollow portion 220c from the bottom of the tray 22 when the tray 22 of the hard drive tray device 2 slides to the expanded position relative to the housing 10 of the server 1, the purpose of easily assembling/disassembling the rear storage devices 12 of the disclosure can be achieved.

Furthermore, in the embodiment of the disclosure, the hollow portion 220c of the base 220 has a width between the first carrying portion 220a and the second carrying portion 220b, and the width of the hollow portion 220c is greater than the length of any of the storage devices 12. Through such a configuration, a sufficient space is provided above the hollow portion 220c of the base 220 for accommodating the rear storage devices 12 that are pulled out of the rack 24 which is on the second carrying portion 220b, and therefore, the user can directly pull the rear storage devices 12 out of the rack 24 on the second carrying portion 220b to the space above the hollow portion 220c when the rear storage devices 12 need to be repaired (in the same manner that the front storage devices 12 are pulled out). Furthermore, when the server 1 is installed at a high place, the user can easily assemble/disassemble the rear storage devices 12 by passing a hand through the hollow portion 220c from the bottom of the base 220 of the tray 22 after the tray 22 is pulled out of the housing 10, and insert or take out the rear storage devices 12 into or from the bottom of the base 220 by passing the rear storage devices 12 through the hollow portion 220c. The actual width of the hollow portion 220c of the base 220 between the first carrying portion 220a and the second carrying portion 220b can be adjusted as needed.

As shown in FIG. 1, a removal direction of each of the storage devices 12 relative to the corresponding rack 24 is parallel to a sliding direction of the tray 22 of the hard drive tray device 2 relative to the housing 10 of the server 1, but the disclosure is not limited in this regard.

In another embodiment of the disclosure, an angle exists between a removal direction of each of the storage devices 12 relative to the corresponding rack 24 and a sliding direction of the tray 22 of the hard drive tray device 2 relative to the housing 10 of the server 1, and the angle can be adjusted according to the height of the place at which the server 1 is installed relative to the height of the user.

As shown in FIG. 1 and FIG. 3, the front storage devices 12 and the rear storage devices 12 are electrically connected to the server 1 by using two transmission cables 12a respectively. The hard drive tray device 2 further includes a cable bracket 26. The cable bracket 26 of the hard drive tray device 2 includes a first bracket portion 260 and a second bracket portion 262. One end of the first bracket portion 260 of the cable bracket 26 is pivotally connected to the inner wall of the housing 10 of the server 1. Two ends of the second bracket portion 262 of the cable bracket 26 are pivotally connected to the base 220 of the tray 22 and another end of the first bracket portion 260, respectively. The transmission cables 12a are attached on the cable bracket 26 of the hard drive tray device 2. Therefore, during the sliding of the tray 22 of the hard drive tray device 2 relative to the housing 10 of the server 1 between the expanded position and the closed position, the cable bracket 26 is expanded or folded together with the sliding of the tray 22 relative to the housing 10.

In other words, when the user pulls out the tray 22 of the hard drive tray device 2 relative to the housing 10 of the server 1, the transmission cables 12a that attach on the cable bracket 26 do not interfere with the movement of the hard drive tray device 2. Furthermore, because the transmission cables 12a are still connected among the storage devices 12 and the server 1 during the moving of the tray 22 of the hard drive tray device 2 relative to the housing 10 of the server 1, the power and signals provided to the storage devices 12 will not be interrupted.

The hard drive tray device 2 further includes a handle 28. The handle 28 of the hard drive tray device 2 is connected to the first carrying portion 220a of the base 220. Therefore, the user can pull out or push in the tray 22 relative the housing 10 of the server 1 by grabbing onto the handle 28.

According to the foregoing recitations of the embodiments of the disclosure, the disclosure provides a hard drive tray device in which at least two carrying portions are disposed on a base of a tray, and the carrying portions can respectively carry two storage devices, thereby allowing the number of storage devices accommodated in a single server to be increased. The hard drive tray device of the disclosure includes a rail member that is disposed at the inner wall of the housing of the server and is slidably engaged with the tray, so when the rear storage devices (i.e., the storage devices that are deeper in the housing) need to be repaired or replaced, a user can assemble/disassemble the rear storage devices in the same way that the front storage devices (i.e., the storage devices that are closer to the periphery of the housing) are assembled/disassembled, namely, by simply pulling the tray out of the housing. In addition, a hollow portion is formed on the base and located between the carrying portions. Therefore, when the server is installed at a high place, the user can easily assemble/disassemble the rear storage devices by passing a hand through the hollow portion from the bottom of the tray after the tray is pulled out of the housing. Moreover, the hard drive tray device of the disclosure includes a cable bracket that is operatively connected to the inner wall of the housing. The cable bracket can slide to be folded relative to the housing together with the tray and be attached by transmission cables used to connect the storage devices to the server. Therefore, when the user pulls out the hard drive tray device, the transmission cables that attach on the cable bracket do not interfere with the movement of the hard drive tray device. Furthermore, because the transmission cables are still connected among the storage devices and the server during the moving of the hard drive tray device, the power and signals provided to the storage devices will not be interrupted.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A hard drive tray device applied in a server, the server comprising a housing, the hard drive tray device comprising:
a slideable structure transitionable between an expanded position and a closed position relative to the housing substantially in a same plane, the slideable structure comprising a first carrying portion and a second carrying portion, the slideable structure configured to receive two or more storage devices disposed at opposing sides of a receiving space between the first carrying portion and the second carrying portion,
wherein in the expanded position, one of the storage devices and at least a part of the receiving space between the first carrying portion and the second carrying portion are located outside the housing, and each of the two storage devices is in substantially the same plane and removable along the plane of a base, and
wherein, in the expanded position, the receiving space extends a receiving length from the first carrying portion to the second carrying portion, the receiving length being greater than a length of any of the two or more storage devices.

2. The hard drive tray device of claim 1, wherein the first carrying portion and the second carrying portion are respectively located at two sides of the receiving space between the first carrying portion and the second carrying portion, each carrying portion is configured to receive at least one of the two or more storage devices.

3. The hard drive tray device of claim 2, wherein in the closed position, the first carrying portion and the second carrying portion are located in the housing, and in the expanded position, the first carrying portion is located outside the housing, and the second carrying portion is located in the housing.

4. The hard drive tray device of claim 2, wherein in the expanded position, the receiving space between the first carrying portion and the second carrying portion is disposed entirely outside the housing, and the second carrying portion is aligned with an edge of the housing.

5. The hard drive tray device of claim 2, further comprising two racks respectively disposed on the first carrying portion and the second carrying portion, wherein each of the storage devices is removably accommodated in the corresponding rack.

6. The hard drive tray device of claim 5, wherein each of the two racks is configured to removably accommodate two or more storage devices.

7. The hard drive tray device of claim 5, wherein a removal direction of each of the storage devices relative to the corresponding rack is parallel to a sliding direction of the slideable structure relative to the housing.

8. The hard drive tray device of claim 1, wherein the hard drive tray device further comprises a cable bracket operatively coupled with the inner wall of the housing, the cable bracket configured to be expanded or folded together with the sliding of the slideable structure relative to the housing, and at least two transmission cables are attached on the cable bracket.

9. The hard drive tray device of claim 8, wherein the cable bracket comprises:
a first bracket portion having one end pivotally coupled with the inner wall of the housing; and
a second bracket portion having two ends, one end pivotally coupled with the slideable structure and the other end pivotally coupled with the first bracket portion.

10. The hard drive tray device of claim 1, wherein the slideable structure further comprises a side plate connected to an edge of the base for slidably engaging a rail member.

* * * * *